United States Patent
Kojima et al.

(10) Patent No.: US 8,466,701 B2
(45) Date of Patent: Jun. 18, 2013

(54) POWER SUPPLY STABILIZING CIRCUIT, ELECTRONIC DEVICE AND TEST APPARATUS

(75) Inventors: Shoji Kojima, Gunma (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 273 days.

(21) Appl. No.: 12/903,137

(22) Filed: Oct. 12, 2010

(65) Prior Publication Data

US 2011/0074497 A1    Mar. 31, 2011

Related U.S. Application Data

(63) Continuation of application No. PCT/JP2008/057528, filed on Apr. 17, 2008.

(51) Int. Cl.
*G01R 31/3187* (2006.01)
(52) U.S. Cl.
USPC .................................. 324/750.3; 324/762.01
(58) Field of Classification Search
None
See application file for complete search history.

(56) References Cited

U.S. PATENT DOCUMENTS

| 5,594,359 | A | 1/1997 | Hashimoto | |
|---|---|---|---|---|
| 6,275,023 | B1 * | 8/2001 | Oosaki et al. | 324/756.06 |
| 2007/0018637 | A1 * | 1/2007 | Kim et al. | 324/158.1 |
| 2007/0096781 | A1 | 5/2007 | Ito | |
| 2007/0200432 | A1 | 8/2007 | Yano et al. | |
| 2009/0128118 | A1 | 5/2009 | Ito | |

FOREIGN PATENT DOCUMENTS

| JP | H07-333249 A | 12/1995 |
|---|---|---|
| JP | 2006-293802 A | 10/2006 |
| JP | 2007-124213 A | 5/2007 |
| JP | 2007-127568 A | 5/2007 |
| JP | 2007-228761 A | 9/2007 |

OTHER PUBLICATIONS

International Search Report (ISR) issued in PCT/JP2008/057528 (parent application) mailed in Jul. 2008 for Examiner consideration, citing U.S. Patent Application Publication Nos. 1, 3, and Foreign Patent Nos. 2-5 listed above.
Written Opinion (PCT/ISA/237) issued in PCT/JP2008/057528 (parent application) mailed in Jul. 2008.
JP Office Action and Machine Translation Dated Nov. 6, 2012; Application No. 2010-508073.

* cited by examiner

*Primary Examiner* — Minh N Tang

(57) ABSTRACT

A test apparatus that tests a device under test, including a signal input section that supplies a test signal to a device under test (DUT) and a judging section that judges acceptability of the DUT based on a response signal output by the DUT in response to the test signal. The signal input section includes an operation circuit that generates the test signal and a power supply stabilizing circuit provided in the same chip to stabilize power supply voltage supplied to the operation circuit. The power supply stabilizing circuit includes a high-speed compensating section compensating for a change in the power supply voltage supplied to the operation circuit, at a predetermined compensation speed, and as low-speed compensating section compensating for the change in the power supply voltage supplied to the operation circuit, at a predetermined compensation speed lower than that of the high-speed compensating section.

19 Claims, 7 Drawing Sheets

POWER SUPPLY STABILIZING CIRCUIT, ELECTRONIC DEVICE AND TEST APPARATUS

BACKGROUND

1. Technical Field

The present invention relates to a power supply stabilizing circuit, an electronic device, and a test apparatus. In particular, the present invention relates to a power supply stabilizing circuit that stabilizes the power supply voltage supplied to an operation circuit of the electronic device, an electronic device that houses the power supply stabilizing circuit, and a test apparatus that uses the power supply stabilizing circuit.

2. Related Art

A known technique for stabilizing the power supply voltage supplied to the operation circuit of an electronic device such as a semiconductor circuit involves connecting a bypass capacitor to the power supply wiring, as described in Patent Document 1. Generally, the bypass capacitor is provided outside of the chip of the electronic device between a ground potential and the power supply line that supplies the electronic device with power.

The change in the current flowing through the power supply line can then be restricted by supplying the electronic device, via the power supply input terminals, with current corresponding to the change in the current consumed by the electronic device. In this way, the change in the power supply voltage due to current fluctuation can be suppressed. The capacitance of the bypass capacitor is usually between tens of nF and several μF.

Patent Document 1: Japanese Patent Application Publication No. H07-333249

However, in the wiring from the power supply input terminals of the electronic device to the operation circuit, the power supply voltage changes according to the change in the current consumed by the operation circuit. This power supply voltage change cannot be compensated for by a bypass capacitor provided outside the chip of the electronic device.

One technique for solving this problem involves providing a similar bypass capacitor within the chip of the electronic device. The gate capacitance of a transistor can be used to realize the capacitor disposed in the chip of the electronic device. However, since the gate capacitance of a single transistor is around tens of fF, an extremely high number of elements must be formed to provide the bypass capacitor within the chip.

Furthermore, when using the bypass capacitor to compensate the power supply voltage, the frequency characteristics of the power supply voltage compensation are determined by the capacitance of the bypass capacitor. Therefore, it is difficult to compensate for the change in the power supply voltage over a wide range using a single bypass capacitor.

SUMMARY

Therefore, it is an object of an aspect of the innovations herein to provide a power supply stabilizing circuit, an electronic device, and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a power supply stabilizing circuit that is provided within a chip of an electronic device and that stabilizes power supply voltage supplied to an operation circuit of the electronic device, the power supply stabilizing circuit including a high-speed compensating section that compensates for a change in the power supply voltage supplied to the operation circuit, at a predetermined compensation speed; and a low-speed compensating section that compensates for the change in the power supply voltage supplied to the operation circuit, at a predetermined compensation speed lower than the compensation speed of the high-speed compensating section.

According to a second aspect related to the innovations herein, provided is an electronic device including an operation circuit and a power supply stabilizing circuit that is provided in the same chip as the operation circuit and that stabilizes power supply voltage supplied to the operation circuit, wherein the power supply stabilizing circuit includes a high-speed compensating section that compensates for a change in the power supply voltage supplied to the operation circuit, at a predetermined compensation speed; and a low-speed compensating section that compensates for the change in the power supply voltage supplied to the operation circuit, at a predetermined compensation speed lower than the compensation speed of the high -speed compensating section.

According to a third aspect related to the innovations herein, provided is a test apparatus that tests a device under test, including a signal input section that generates a predetermined test signal and supplies the test signal to the device under test; and a judging section that judges acceptability of the device under test based on a response signal output by the device under test in response to the test signal. In the test apparatus, the signal input section includes an operation circuit that operates to generate the test signal; and a power supply stabilizing circuit that is provided in the same chip as the operation circuit and that stabilizes power supply voltage supplied to the operation circuit. The power supply stabilizing circuit includes a high-speed compensating section that compensates for a change in the power supply voltage supplied to the operation circuit, at a predetermined compensation speed; and a low -speed compensating section that compensates for the Change in the power supply voltage supplied to the operation circuit, at a predetermined compensation speed lower than the compensation speed of the high-speed compensating section.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to what is provided by aspects of the invention.

Figure 1:
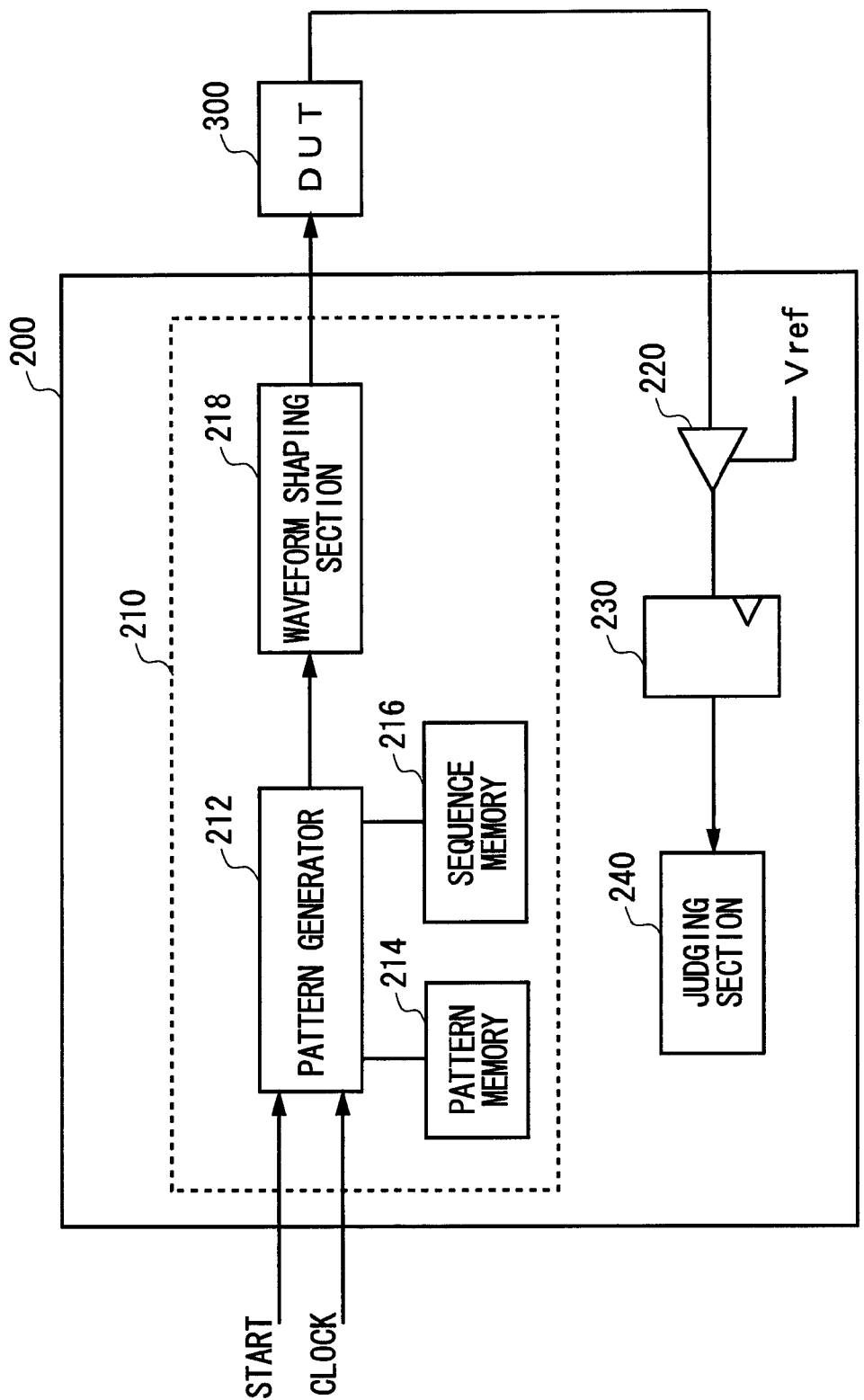
FIG. 1 shows an exemplary configuration of a test apparatus 200 according to an embodiment of the present invention.

FIG. 1 shows an exemplary configuration of a test apparatus 200 according to an embodiment of the present invention. The test apparatus 200 tests a device under test 300 such as a semiconductor circuit, and includes a signal input section 210, a level comparing section 220, a timing comparing section 230, and a judging section 240.

The signal input section 210 generates a predetermined test signal and supplies this test signal to the device under test 300. For example, the signal input section 210 may generate a test signal having a predetermined logic pattern based on pattern data and sequence data provided in advance by a user. More specifically, the signal input section 210 may generate the logic pattern of the test signal by reading the pattern data in an order defined by the sequence data.

The signal input section 210 may instead generate the predetermined test signal using another method. For example, the signal input section 210 may generate the logic pattern of the test signal based on a predetermined arithmetic procedure or algorithm. In the example of FIG. 1, the signal input section 210 generates the test signal based on pattern data and sequence data.

The signal input section 210 of the present invention includes a pattern generator 212, a pattern memory 214, a sequence memory 216, and a waveform shaping section 218. The pattern memory 214 stores in advance pattern data supplied from an external controller or the like that controls the test apparatus 200. The pattern memory 214 may store pattern data in each address.

The sequence memory 216 stores in advance the sequence data provided from the controller. The sequence data may sequentially designate addresses of the pattern memory 214.

The pattern generator 212 generates the logic pattern of the test signal according to an operation control signal supplied from the controller. The operation control signal may be a START signal that designates a timing at which generation of the logic pattern starts, a CLOCK signal that designates the operational period of the pattern generator 212, or the like. The pattern generator 212 may begin reading the sequence data from the sequence memory 216 in response to a rising edge of the START signal. The pattern generator 212 may generate the logic pattern of the test signal by sequentially reading the pattern data according to the CLOCK signal from the addresses sequentially designated by the sequence data.

The sequence memory 216 may store a plurality of types of sequence data. In this case, the pattern generator 212 may read the sequence data designated by the operation control signal and generate a logic pattern corresponding to this sequence data. In this way, the sequence memory 216 can generate a plurality of types of logic patterns.

The waveform shaping section 218 generates the test signal to have the logic pattern generated by the pattern generator 212. For example, the waveform shaping section 218 may generate the test signal to have a predetermined amplitude and bit rate and to have a waveform corresponding to the logic pattern generated by the pattern generator 212. The waveform shaping section 218 supplies the device under test 300 with the generated test signal.

The device under test 300 operates according to the test signal supplied thereto to output a response signal corresponding to an operational result. The level comparing section 220 receives the response signal from the device under test 300 and compares the signal level of the response signal to a preset reference level Vref. The level comparing section 220 of the present embodiment outputs logic H while the signal level of the response signal is greater than the reference level Vref and outputs logic L while the signal level of the response signal is less than or equal to the reference level Vref.

The timing comparing section 230 samples the logic value output by the level comparing section 220, according to a strobe signal supplied thereto. The timing comparing section 230 may measure the logic pattern of the response signal by detecting the logic value of the response signal in each bit region.

The judging section 240 judges acceptability of the device under test 300 based on the measurement result of the response signal by the level comparing section 220 and the timing comparing section 230. The judging section 240 may judge the acceptability of the device under test 300 based on whether the logic pattern of the response signal measured by the timing comparing section 230 matches a predetermined expected value pattern. With this configuration, the device under test 300 can be tested.

Figure 2:
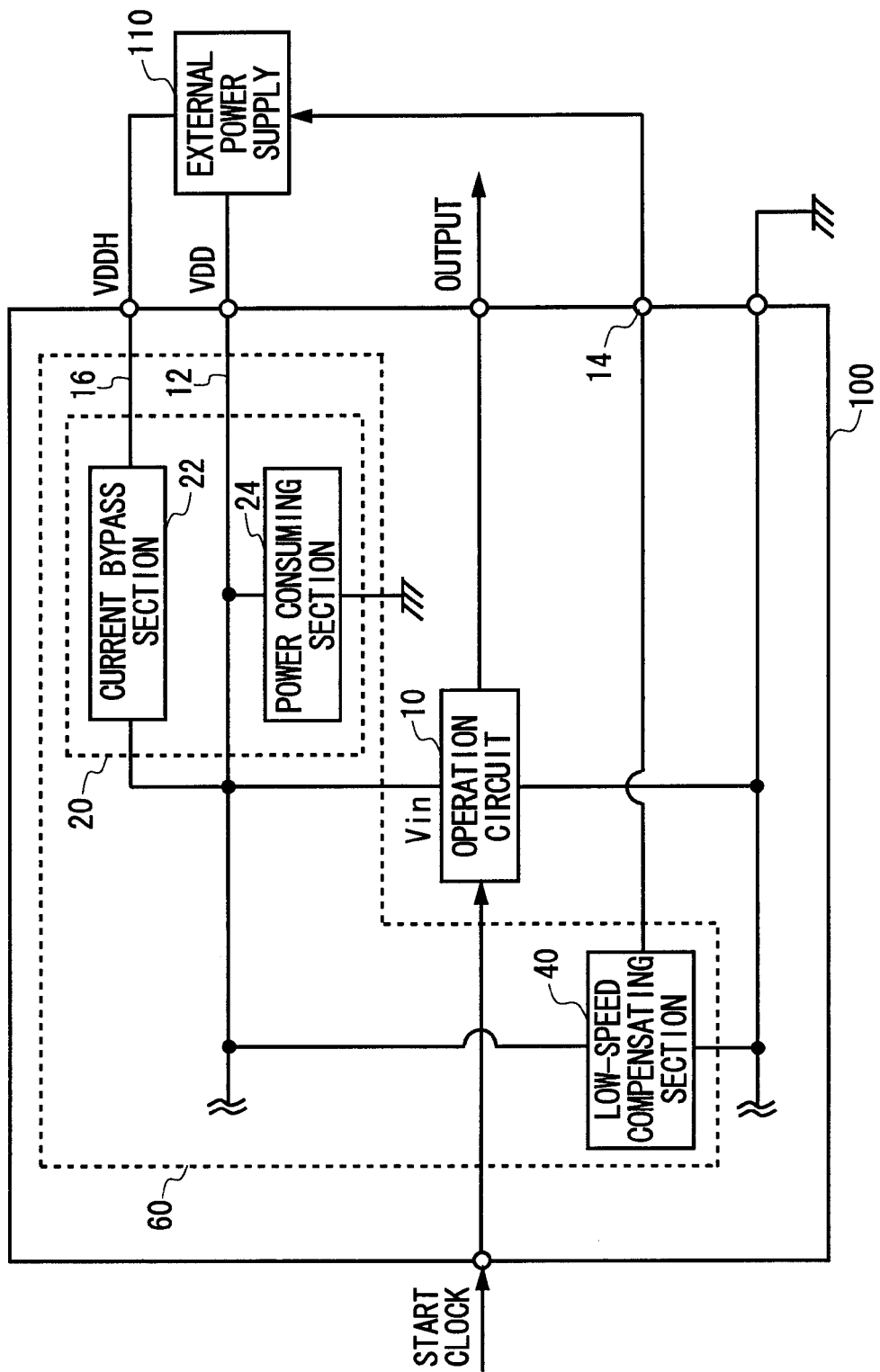
FIG. 2 shows an exemplary configuration of an electronic device 100 used in the test apparatus 200.

FIG. 2 shows an exemplary configuration of an electronic device 100 used in the test apparatus 200. The electronic device 100 may function as the signal input section 210 described in FIG. 1, or may function as a portion of the signal input section 210. In the present embodiment, the electronic device 100 functions as the pattern generator 212.

The electronic device 100 includes an operation circuit 10, a main power supply line 12, an auxiliary power supply line 16, and a power supply stabilizing circuit 60. The power supply stabilizing circuit 60 includes a high-speed compensating section 20, a low-speed compensating section 40, and an external control terminal 14. The configurations described in relations to FIGS. 2 to 7B, aside from configurations of the operation circuit 10, may function as a portion of the power supply stabilizing circuit 60 for stabilizing the power supply voltage applied to the operation circuit 10.

The operation circuit 10 of the present embodiment functions as the pattern generator 212. For example, the operation circuit 10 may generate the predetermined logic pattern according to an operation control signal, such as the START signal and the CLOCK signal, supplied thereto. The START signal may cause the generation of the logic pattern to begin. The CLOCK signal may designate the operational period of the operation circuit 10.

The operation circuit 10 receives supply power from an external power supply 110 provided outside the chip of the electronic device 100. The operation circuit 10 may receive the supply power from the external power supply 110 via the main power supply line 12 and the auxiliary power supply line 16. The main power supply line 12 and the auxiliary power supply line 16 may each be independent lines. When the power supply current from the main power supply line 12 to the operation circuit 10 is insufficient, the auxiliary power supply line 16 may supply the operation circuit 10 with power supply current.

The high-speed compensating section 20 and the low-speed compensating section 40 each compensate for the change in the power supply voltage supplied to the operation circuit 10 with a predetermined compensation speed. For example, the current consumed by the operation circuit 10 can change depending on the operational state of the operation circuit 10. The main power supply line 12 has a resistance component, and therefore, when the current consumed by the operation circuit 10 changes, the amount of the voltage drop in the main power supply line 12 also changes, thereby causing the power supply voltage supplied to the operation circuit 10 from the main power supply line 12 to change. The high-speed compensating section 20 and the low-speed compensating section 40 operate to compensate for the change in the power supply voltage.

The low-speed compensating section 40 compensates for the change in the power supply voltage with a lower compensation speed than the high-speed compensating section 20. The frequency of the control signal generated by the low-speed compensating section 40 to compensate for the voltage change may be lower than the frequency of the control signal generated by the high-speed compensating section 20 to compensate for the voltage change. The upper limit of the frequency band of the power supply voltage change that the low-speed compensating section 40 can compensate for may be lower than the upper limit of the frequency band of the power supply voltage change that the high-speed compensating section 20 can compensate for. The speed at which the low-speed compensating section 40 follows a change in the power supply voltage may be lower than the speed at which the high-speed compensating section 20 follows a change in the power supply voltage.

By providing a plurality of compensation circuits with different compensation speeds in this way, the change in the power supply voltage supplied to the operation circuit 10 can be compensated for over a wide bandwidth. In the present embodiment, the electronic device 100 is provided with two compensation circuits, but the electronic device 100 may instead be provided with a greater number of compensation circuits having different compensation speeds.

The low-speed compensating section 40 detects the change of the power supply voltage within the chip of the electronic device 100 and compensates for the change in the power supply voltage based on the detection result. The low-speed compensating section 40 of the present embodiment is provided in parallel with the operation circuit 10 and receives in parallel the power supply voltage applied to the operation circuit 10. The low-speed compensating section 40 detects the change in the received power supply voltage and controls the power supply voltage output from the external power supply 110 to the operation circuit 10. The low-speed compensating section 40 may generate a control signal to control the external power supply 110, based on the detected change in the power supply voltage. The external control terminal 14 is connected to a control terminal of the external power supply 110 and controls the level of the power supply voltage output by the external power supply 110 based on the control signal generated by the low-speed compensating section 40.

With this type of feedback control, the low-speed compensating section 40 can restrict the change in the power supply voltage. The compensation speed of the low-speed compensating section 40 preferably does not cause oscillation due to feedback.

The high-speed compensating section 20 compensates for the change in the power supply voltage based on prediction data that is predicted for the operation pattern of the operation circuit 10. The high-speed compensating section 20 may store this prediction data in advance. The operation pattern of the operation circuit 10 may refer to a pattern by which the current consumed by the operation circuit 10 changes according to the operation of the operation circuit 10. The operation circuit 10 of the present embodiment generates a predetermined logic pattern using pattern data and sequence data supplied thereto in advance, for example, and therefore the operation of the operation circuit 10 can be predicted in advance, as can the pattern of the change in the current consumed by the operation circuit 10.

A user or the like may generate the prediction data by predicting the operation pattern of the operation circuit 10 in a simulation, based on the pattern data and sequence data or the like provided to the operation circuit 10, and store the prediction data in the high-speed compensating section 20. Instead, a user or the like may generate the prediction data by measuring in advance the pattern of the change in the current consumed by the operation circuit 10 when the operation circuit 10 actually operates according to the pattern data and the sequence data.

The high-speed compensating section 20 compensates for the change in the power supply voltage applied to the operation circuit 10 by causing the compensation circuit provided in the chip of the electronic device 100 to operate based on the prediction data. The high-speed compensating section 20 of the present embodiment includes a current bypass section 22 and a power consuming section 24 as the compensation circuit.

The current bypass section 22 controls whether the bypass current from the auxiliary power supply line 16 is supplied to the main power supply line 12 that provides the power supply voltage from the external power supply 110 to the operation circuit 10, based on the prediction data supplied to the high-speed compensating section 20. For example, the current bypass section 22 may supply, to a bypass point of the main power supply line 12 near the operation circuit 10, a bypass current corresponding to the change in the current consumed by the operation circuit 10, based on the prediction data. As a result, the bypass section 22 can restrict the change in the amount of drop in voltage from the external power supply 110 at this bypass point, which is caused by the change in the current consumed by the operation circuit 10.

The power consuming section 24 receives power from the external power Sup ply 110 in parallel with the operation circuit 10, and consumes this power. The power consuming section 24 may be a heater that consumes the supply power received from the main power supply line 12. The power consuming section 24 may consume the power supply current such that the sum of the current consumed by the operation circuit 10 and the current consumed by the power consuming section 24 remains substantially constant. In this way, the power consuming section 24 can prevent the change of the voltage drop of the main power supply line 12.

The compensation speed of the power consuming section 24 may be higher than the compensation speed of the current bypass section 22. The power consuming section 24 compensates for the change in the voltage by turning the heater ON and OFF, and can therefore operate at higher speed than the current bypass section. The high-speed compensating section 20 may include one of the current bypass section 22 and the power consuming section 24.

By using this high-speed compensating section 20, the change in the power supply voltage can be compensated for via feed-forward control. Furthermore, by combining the low-speed compensating section 40 and the high-speed compensating section 20, the feedback control and feed-forward control are combined to enable compensation for the change in the power supply voltage. Therefore, oscillation due to the feedback control is prevented and the change in the power supply voltage can be compensated for over a wide bandwidth. By combining (i) the high-speed compensating section 20 that compensates for the change in the power supply voltage within the chip of the electronic device 100 and (ii) a circuit that compensates for the change in the power supply voltage using another method, such as the low-speed compensating section 40 that compensates for the change in the power supply voltage from the external power supply 110, outside the chip of the electronic device 100, the change in the power supply voltage can be compensated for even if one of the circuits is damaged.

Figure 3:
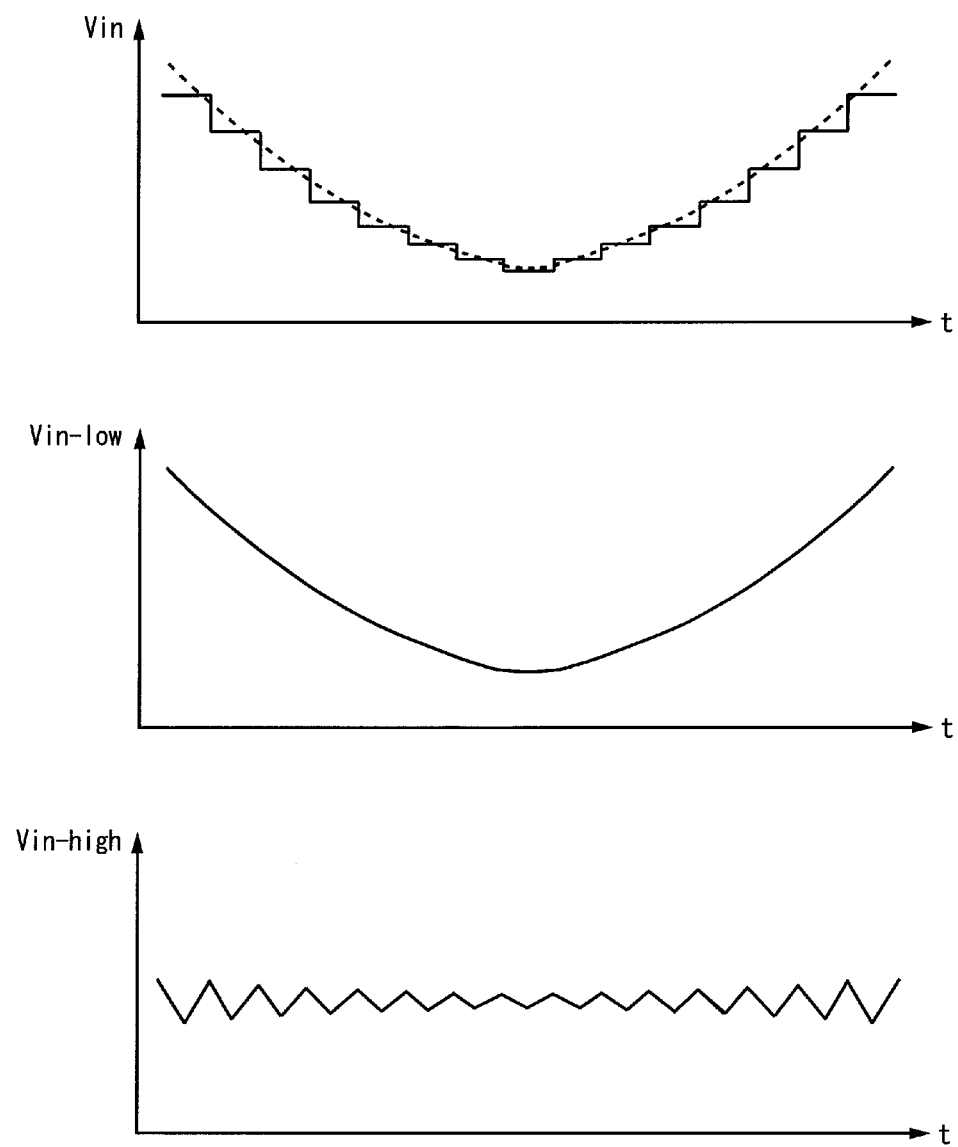
FIG. 3 shows examples of a change pattern of the power supply voltage Vin applied to the operation circuit 10, a change component Vin_low of the power supply voltage compensated by the low-speed compensating section 40, and a change component Vin_high of the power supply voltage compensated by the high-speed compensating section 20.

FIG. 3 shows examples of a change pattern of the power supply voltage Vin applied to the operation circuit 10, a change component Vin_low of the power supply voltage compensated by the low-speed compensating section 40, and a change component Vin_high of the power supply voltage compensated by the high-speed compensating section 20. As described above, the low-speed compensating section 40 compensates for a low frequency component in the change pattern of the power supply voltage Vin. The high-speed compensating section 20 compensates for a high frequency component in the change pattern of the power supply voltage Vin. Using this control, the change in the power supply voltage can be compensated for over a wide bandwidth.

The power consumed when the low-speed compensating section 40 compensates for a predetermined change amount in the power supply voltage may be less than the power consumed when the high-speed compensating section 20 compensates for the same predetermined change amount in the power supply voltage. As described above, the low-speed compensating section 40 compensates for the change in the power supply voltage by controlling the external power supply 110, and therefore consumes less power than the high-speed compensating section 20, which includes the power consuming section 24 such as a heater. The low frequency component of the voltage change often has a greater amplitude than the high frequency component, as shown in FIG. 3, but the overall power consumption of the circuits can be decreased by lowering the power consumed by the low-speed compensating section 40.

Figure 4:
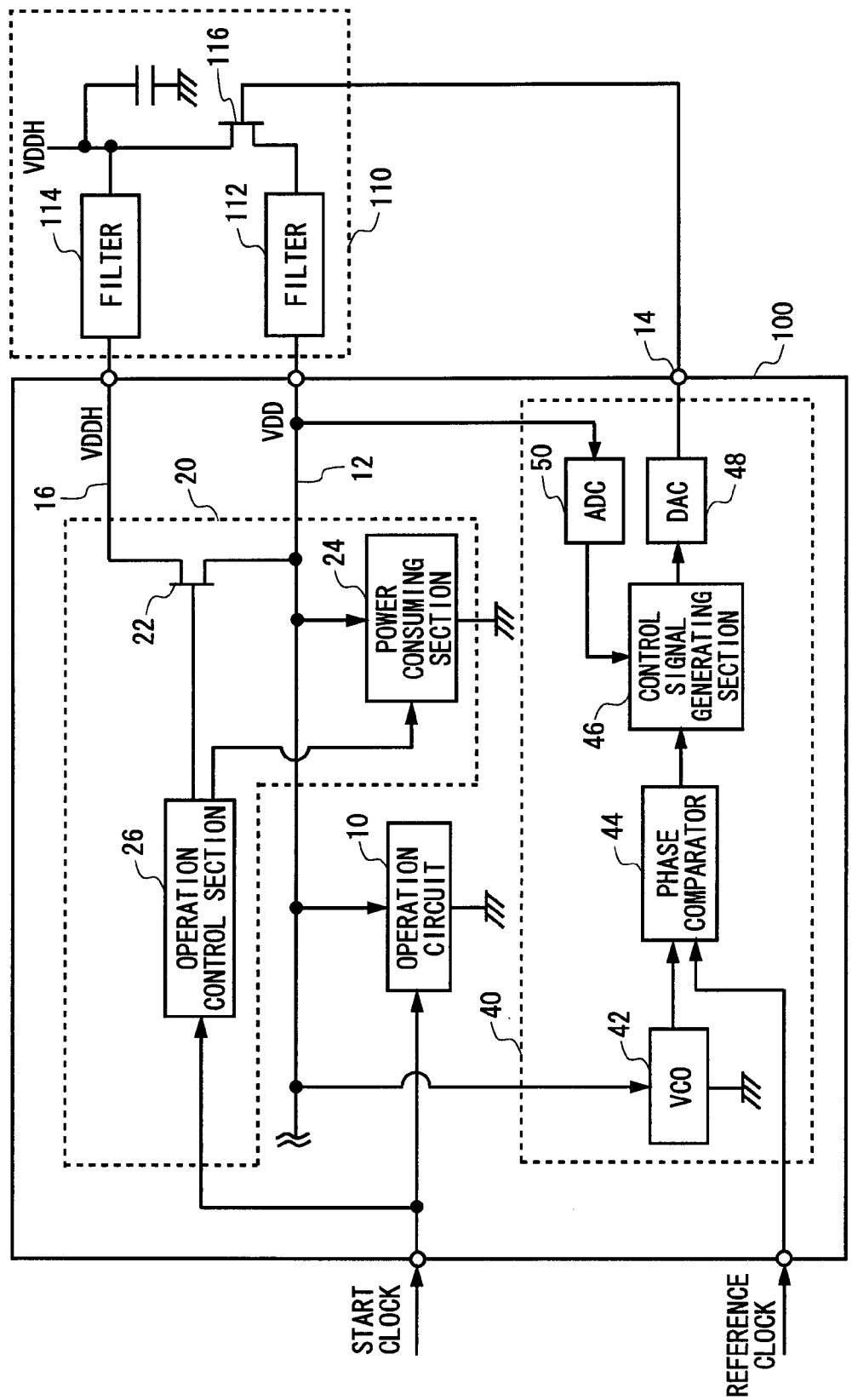
FIG. 4 shows a detailed exemplary configuration of the electronic device 100.

FIG. 4 shows a detailed exemplary configuration of the electronic device 100. The low-speed compensating section 40 of the present embodiment includes a voltage controlled oscillator 42, a phase comparator 44, a control signal generating section 46, a control signal converting section 48, and a voltage detecting section 50.

The voltage controlled oscillator 42 receives the power supply voltage in parallel with the operation circuit 10 and outputs an oscillated signal with a frequency corresponding to the power supply voltage. The voltage controlled oscillator 42 may be a circuit that generates an oscillated signal by connecting, in a loop, delay elements having delay amounts that change according to the power supply voltage. The voltage controlled oscillator 42 may receive the power supply voltage from the main power supply line 12.

The phase comparator 44 compares the phase of the oscillated signal output by the voltage controlled oscillator 42 to the phase of a predetermined reference clock. The reference clock has a prescribed period and may be supplied from the outside. The voltage controlled oscillator 42 may generate an oscillated signal having substantially the same phase as the reference clock when the power supply voltage of the operation circuit 10 in a quiescent state is supplied thereto.

The control signal generating section 46 generates the control signal for controlling the external power supply 110 based on the comparison result from the phase comparator 44. For example, when the phase comparator 44 detects a phase difference between the oscillated signal and the reference clock, this phase difference corresponds to the amount of change in the power supply voltage. The control signal generating section 46 may generate the control signal to change the level of the power supply voltage output by the external power supply 110 by the amount of change corresponding to this phase difference.

As shown in FIG. 4, the external power supply 110 of the present embodiment includes a power transistor 116, an auxiliary power supply line side filter 114, and a filter 112 on the main power supply line side. The power transistor 116 receives a DC voltage VDDH and repeatedly switches whether the DC voltage VDDH is output. The filter 112 on the main power supply line side passes a low frequency component of the voltage output by the power transistor 116. In other words, the external power supply 110 may be a switching power supply that outputs the power supply voltage according to an ON interval and an OFF interval of the power transistor 116. The filter 114 passes the DC voltage VDDH to the auxiliary power supply line 16.

The control signal generating section 46 may generate the control signal to control the OFF interval and the ON interval of the power transistor 116 based on the comparison result of the phase comparator 44. The control signal may be a digital pulse signal, and the control signal generating section 46 may control the pulse width or the pulse density of the control signal based on the comparison result of the phase comparator 44. When controlling the pulse density of the control signal, sigma-delta modulation may be used.

The control signal converting section 48 converts the digital control signal generated by the control signal generating section 46 into an analog control signal. The control signal converting section 48 supplies the analog control signal to a gate terminal of the power transistor via the external control terminal 14. With this configuration, the change in the power supply voltage of the operation circuit 10 can be compensated for by controlling the power supply voltage output by the external power supply 110.

Instead of a voltage signal, the control signal converting section 48 may supply the pulse signal generated by the control signal generating section 46 to the power transistor 116 as-is or with an increased amplitude. In other words, the power transistor 116 may operate as a source follower circuit or as a switching element.

The voltage detecting section 50 detects the power supply voltage supplied from the power transistor 116 to the operation circuit 10. The voltage detecting section 50 of the present embodiment detects the voltage of the main power supply line 12 in the chip of the electronic device 100. The control signal generating section 46 may generate the control signal further based on the detection result of the voltage detecting section 50. The voltage detecting section 50 may detect the change in the power supply voltage at a higher frequency than the voltage controlled oscillator 42. In other words, the voltage detecting section 50 may detect, in the change of the power supply voltage, a frequency component that is higher than the frequency component that can be followed by the voltage controlled oscillator 42.

The high-speed compensating section 20 of the present embodiment includes an operation control section 26, a current bypass section 22, and a power consuming section 24. The current bypass section 22 switches whether a bypass current flows from the auxiliary power supply line 16 to the main power supply line 12, as described above. The power consuming section 24 receives the power supply current from the main power supply line 12 and consumes this current.

The operation control section 26 operates in parallel with the operation circuit 10, and causes the current bypass section 22 and the power consuming section 24 to operate using the predetermined prediction data. The operation control section 26 may begin controlling the power consuming section 24 and the current bypass section 22 in response to the operation control signal, such as the START signal, supplied to the operation circuit 10.

The operation control section 26 may control the amount of power consumed by the power consuming section 24 by operating in parallel with the operation circuit 10 to cause the power consuming section 24 to operate according to an ON/OFF pattern that is predetermined for each element of the power consuming section 24. The operation control section 26 may control the power consuming section 24 such that the sum of the current consumed by the operation circuit 10 and the power consuming section 24 remains substantially constant, based on the change pattern of the current consumed by the operation circuit 10, which is provided in advance.

The operation control section 26 may operate in parallel with the operation circuit 10 to control the current bypass section 22 according to the predetermined current change pattern. A specific description of the control of the current bypass section 22 is described further below in FIGS. 5 to 7B. With the configuration described above, change in the power supply voltage can be accurately compensated for over a wide bandwidth.

The voltage controlled oscillator 42 may detect a temperature change in the operation circuit 10 in addition to detecting the change in the power supply voltage of the operation circuit 10. In this case, the voltage controlled oscillator 42 may generate the oscillated signal using elements whose delay amounts change according to a change in the surrounding temperature. Here, it is preferable that the voltage controlled oscillator 42 be provided near the operation circuit 10. Since the power consuming section 24 becomes heated by consuming power, the power consuming section 24 is preferably disposed in a region distanced from the voltage controlled oscillator 42. The distance between the voltage controlled oscillator 42 and the power consuming section 24 may be greater than the distance between the voltage controlled oscillator 42 and the operation circuit 10.

Figure 5:
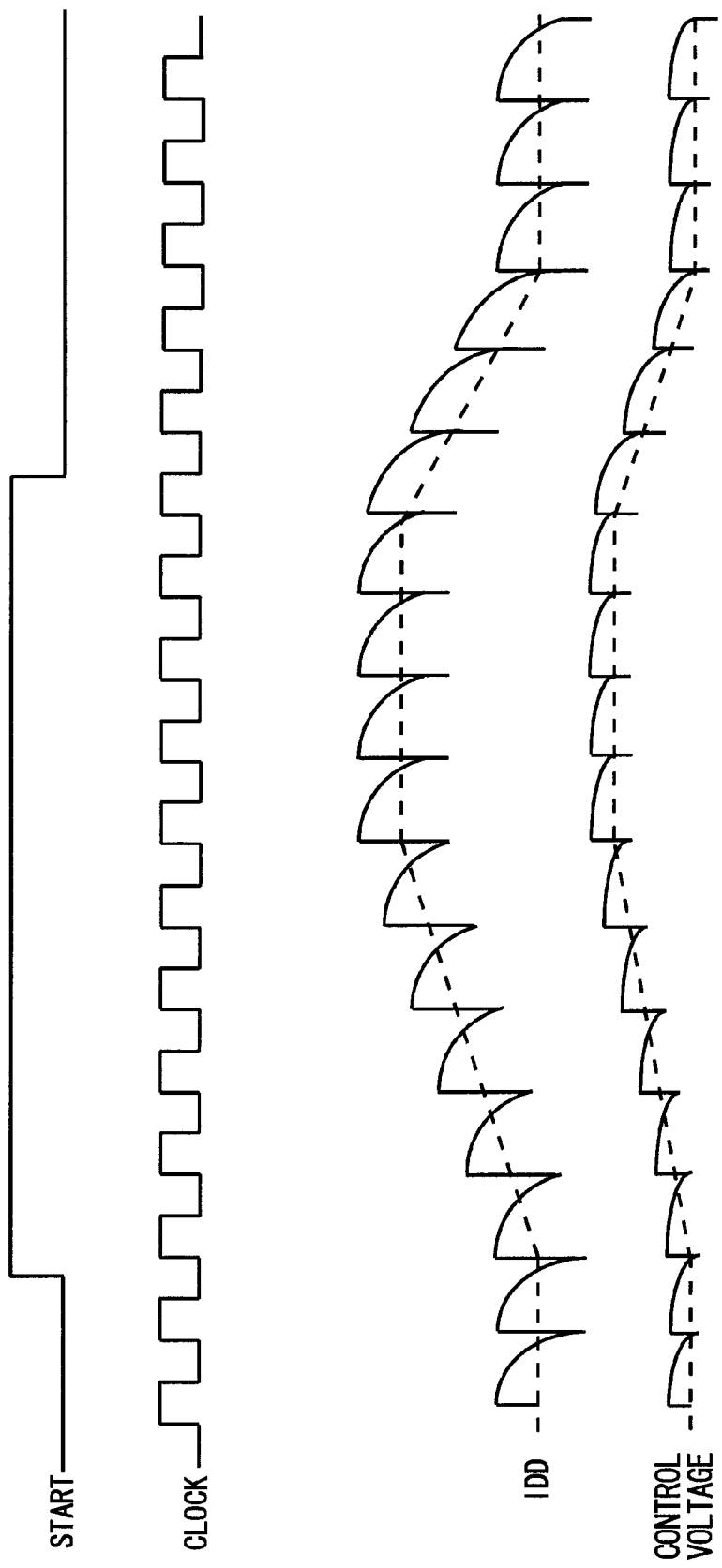
FIG. 5 shows an exemplary operation of the current bypass section 22.

FIG. 5 shows an exemplary operation of the current bypass section 22. FIG. 5 shows exemplary waveforms of the START signal, the CLOCK signal, the consumed current IDD of the operation circuit 10, and the control voltage output by the operation control section 26.

The operation circuit 10 begins operating in response to a rising edge of the START signal. As another example, the operation circuit 10 may begin operating in response to the first pulse in the CLOCK signal. The operation circuit 10 stops operating in response to a falling edge of the START signal. As another example, the operation circuit 10 may stop operating when pulses of the CLOCK signal are no longer received.

The consumed current IDD of the operation circuit 10 changes according to the operation of the operation circuit 10. In the present example, as shown by the solid line in FIG. 5, the consumed current IDD of the operation circuit 10 gradually increases from when the operation circuit 10 begins operating. Furthermore, the consumed current IDD of the operation circuit 10 stabilizes after a predetermined time has passed from when the operation circuit 10 begins operating, and the consumed current IDD gradually drops to substantially zero when the operation circuit 10 stops operating.

The operation control section 26 may be set in advance with a current change pattern corresponding to the change pattern of the consumed current IDD. The operation control section 26 may be set with a current change pattern that linearly approximates a change pattern of the consumed current IDD obtained through an estimation or actual measurement. The operation control section 26 outputs a control voltage corresponding to this current change pattern. The operation control section 26 may output a control voltage that results in the current bypass section 22 having a bypass current substantially equal to the change component of the consumed current IDD. The operation control section 26 may output, as the control voltage, a voltage determined according to a characteristic of the current bypass section 22 and the current change pattern of the bypass current to be generated.

Figure 6:
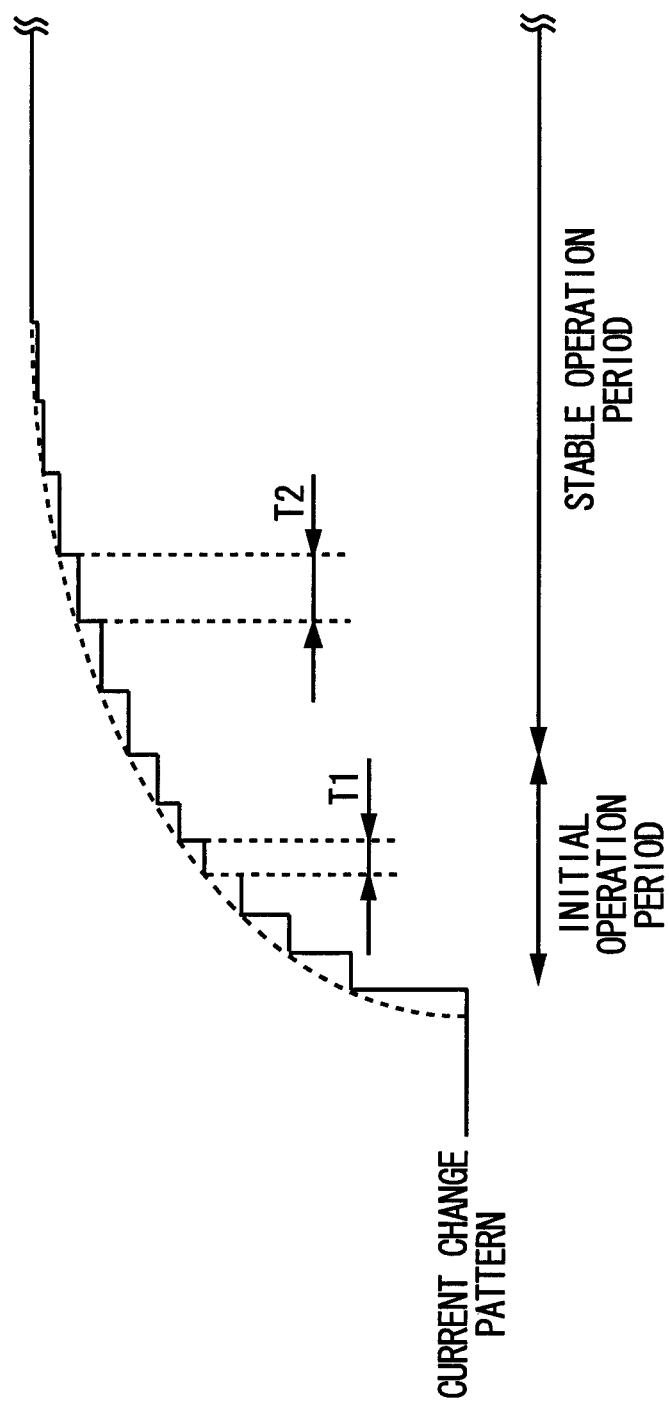
FIG. 6 shows an exemplary current change pattern set for the operation control section 26.

FIG. 6 shows an exemplary current change pattern set for the operation control section 26. As shown in FIG. 6, a current change pattern whose value changes at predetermined time intervals is set for the operation control section 26. In this case, the current change pattern set for the operation control section 26 may cause a time interval T1 during which the current value changes to be shorter than a time period T2 during which the current value changes, where the interval T1 is from when control of the bypass current begins to when a predetermined initial operation period ends and the interval T2 is after the initial operation period has passed. By controlling the bypass current according to this current change pattern, the operation control section 26 can compensate for the change in the power supply voltage more quickly during the initial operation period, which is when the change of the consumed current IDD is greater.

Figure 7A:
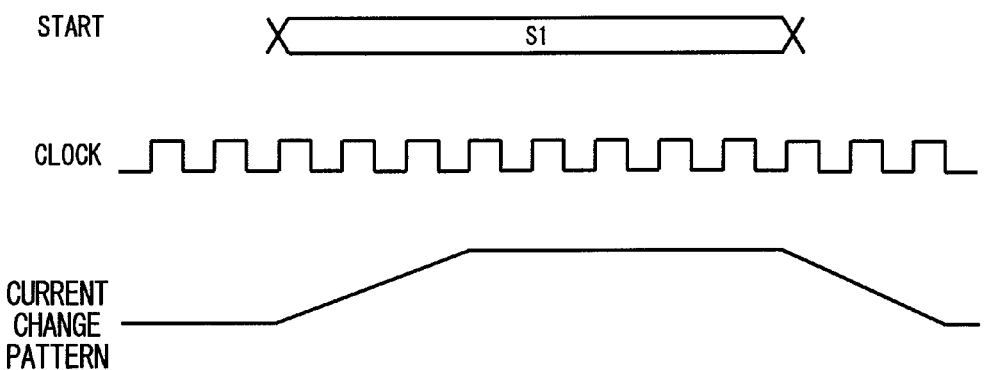
FIG. 7A shows a current change pattern corresponding to sequence data S1.
Figure 7B:
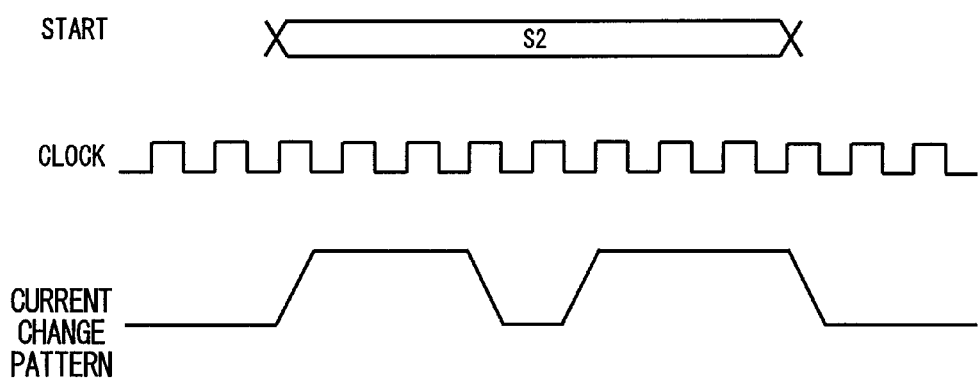
FIG. 7B shows a current change pattern corresponding to sequence data S2.

FIGS. 7A and 7B show other examples of current change patterns set for the operation control section 26. In these examples, the operation circuit 10 performs a predetermined operation for each type of operation control signal supplied thereto to generate logic patterns corresponding to the type of the operation control signal. The operation control section 26 stores in advance a plurality of types of current change patterns corresponding to the plurality of types of operation control signals.

Here, the type of an operation control signal may refer to designation of a piece of sequence data from among the plurality of pieces of sequence data stored in the sequence memory 216. The operation control signal may be provided to the operation circuit 10 separately from the START signal and the CLOCK signal described above. The operation control section 26 selects the current change pattern corresponding to the type of operation control signal supplied to the operation circuit 10, and controls the bypass current according to the selected pattern.

FIGS. 7A and 7B show examples of a plurality of types of current change patterns stored in advance in the operation control section 26. FIG. 7A shows a current change pattern corresponding to sequence data S1. FIG. 7B shows a current change pattern corresponding to sequence data S2. In these examples, the START signal designates which sequence data is selected.

When the operation circuit 10 operates according to different sequence data, the consumed current of the operation circuit 10 changes differently, as shown in FIGS. 7A and 7B. Therefore, the operation control section 26 identifies which sequence data the operation circuit 10 is operating with, based on the operation control signal, i.e. the START signal. The operation control section 26 then controls the bypass current Ib using the current change pattern corresponding to the identified sequence data. In this way, the change in the power supply voltage supplied to the operation circuit 10 can be accurately restricted.

The operation control section 26 may control the bypass current using a different current change pattern for different temperatures of the operation circuit 10. The electronic device 100 may include a sensor that detects the temperature of the operation circuit 10. As another example, the operation control section 26 may control the bypass current using a different current change pattern depending on the continuous operation time of the operation circuit. The electronic device 100 may include a measuring section that measures the continuous operation time of the operation circuit.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, FIGS. 1 to 7B describe an electronic device 100 used in a test apparatus 200, but the electronic device 100 is not limited to being used in a test apparatus 200. The electronic device 100 may be used in any of a variety of ways as long as the change pattern of the consumed current of a device can be estimated.

Furthermore, a START signal and a CLOCK signal are used as examples of the operation control signal, but the operation control signal is not limited to this. A data signal, an address signal, or the like provided to the operation circuit 10 may instead be used as the operation control signal.

By using the power supply stabilizing circuit and the electronic device 100 described above, the change in power supply voltage due to change in the consumed current of the operation circuit 10, which occurs in a power supply line within the electronic device 100, can be accurately compensated for over a wide bandwidth. Furthermore, the test apparatus 200 can generate a test signal in which the change of the power supply voltage of the operation circuit 10 is compensated for over a wide bandwidth, and can therefore accurately test a device under test 300.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A power supply stabilizing circuit that is provided within a chip of an electronic device and that stabilizes power supply voltage supplied to an operation circuit of the electronic device, the power supply stabilizing circuit comprising:
a high-speed compensating section that compensates for a change in the power supply voltage supplied to the operation circuit, at a predetermined compensation speed; and
a low-speed compensating section that compensates for the change in the power supply voltage supplied to the operation circuit, at a predetermined compensation speed lower than the compensation speed of the high-speed compensating section.

2. The power supply stabilizing circuit according to claim 1, wherein
the low-speed compensating section detects the change in the power supply voltage within the chip of the electronic device, and compensates for the change in the power supply voltage based on the detection result, and
the high-speed compensating section compensates for the change in the power supply voltage based on prediction data obtained by predicting in advance an operation pattern of the operation circuit.

3. The power supply stabilizing circuit according to claim 2, wherein
the electronic device is provided with power from an external power supply that generates the power supply voltage outside the chip of the electronic device, and
the low-speed compensating section controls voltage generated by the external power supply based on the change in the power supply voltage detected in the chip of the electronic device.

4. The power supply stabilizing circuit according to claim 3, wherein
the high-speed compensating section compensates for the change in the power supply voltage by causing a compensation circuit provided within the chip of the electronic device to operate according to the prediction data.

5. The power supply stabilizing circuit according to claim 4, wherein
power consumed by the low-speed compensating section when compensating for a predetermined change amount in the power supply voltage is less than power consumed by the high-speed compensating section when compensating fix the same change amount in the power supply voltage.

6. The power supply stabilizing circuit according to claim 5, wherein the low-speed compensating section further includes:
a voltage controlled oscillator that receives the power supply voltage in parallel with the operation circuit and outputs an oscillated signal with a frequency corresponding to the power supply voltage;
a phase comparator that compares a phase of the oscillated signal to a phase of a predetermined reference clock; and
a control signal generating section that generates a control signal for controlling the external power supply, based on the comparison result of the phase comparator.

7. The power supply stabilizing circuit according to claim 6, wherein
the external power supply is a switching power supply that outputs the power supply voltage according to a period during which a power transistor connected to the power supply is ON, and
the control signal generating section generates the control signal to control the period during which the power transistor is ON, based on the comparison result of the phase comparator.

8. The power supply stabilizing circuit according to claim 7, wherein
the low-speed compensating section further includes a voltage detecting section that detects, in the change of the power supply voltage supplied to the operation circuit from the power transistor, a frequency component that is higher than a frequency component that can be followed by the voltage controlled oscillator, and the control signal generating section generates the control signal further based on the detection result of the voltage detecting section.

9. The power supply stabilizing circuit according to claim 6, wherein the high-speed compensating section includes:
a power consuming section that receives power from the external power supply in parallel with the operation circuit, and consumes the power; and
an operation control section that operates in parallel with the operation circuit to control the amount of power consumed by the power consuming section by causing the power consuming section to operate with a predetermined operation pattern.

10. The power supply stabilizing circuit according to claim 9, wherein
the high-speed compensating section further includes a current bypass section that controls whether a bypass current from an auxiliary power supply line different from the main power supply line is supplied to the main power supply line, which supplies the power supply voltage from the external power supply to the Operation circuit, and
the operation control section operates in parallel with the operation circuit to control the current bypass section according to a predetermined current change pattern.

11. The power supply stabilizing circuit according to claim 10, wherein
the operation control section begins controlling the power consuming section and the current bypass section according to an operation control signal supplied to the operation circuit.

12. The power supply stabilizing circuit according to claim 11, wherein
the operation circuit performs a predetermined operation for each of a plurality of types of the operation control signals supplied thereto, and
the operation control section stores in advance a plurality of types of the operation patterns and a plurality of types of the current change patterns corresponding to the plurality of types of operation control signals, and selects the operation pattern and the current change pattern corresponding to the type of the operation control signal supplied to the operation circuit to control the power consuming section and the current bypass section.

13. The power supply stabilizing circuit according to claim 9, wherein
distance between the voltage controlled oscillator and the power consuming section is greater than distance between the voltage controlled oscillator and the operation circuit.

14. A device comprising:
a high-speed compensating section that compensates for a change in a power supply voltage supplied to an operation circuit, at a predetermined compensation speed; and
a low-speed compensating section that compensates for the change in the power supply voltage supplied to the operation circuit, at a predetermined compensation speed lower than the compensation speed of the high-speed compensating section.

15. The device according to claim 14, wherein
the low-speed compensating section detects the change in the power supply voltage, and compensates for the change in the power supply voltage based on the detection result, and
the high-speed compensating section compensates for the change in the power supply voltage based on prediction data obtained by predicting in advance an operation pattern.

16. The device according to claim 15, wherein
the device is provided with power from an external power supply that generates the power supply voltage outside the device,
the low-speed compensating section controls voltage generated by the external power supply based on the change in the power supply voltage detected by the device; and
the high-speed compensating section compensates for the change in the power supply voltage by causing a compensation circuit provided within a chip of the device to operate according to the prediction data.

17. A test apparatus that tests a device under test, comprising:
a signal input section that generates a predetermined test signal and supplies the test signal to the device under test; and
a judging section that judges acceptability of the device under test based on a response signal output by the device under test in response to the test signal, wherein
the signal input section includes;
an operation circuit that operates to generate the test signal; and
a power supply stabilizing circuit that is provided in the same chip as the operation circuit and that stabilizes power supply voltage supplied to the operation circuit, and
the power supply stabilizing circuit includes;
a high-speed compensating section that compensates for a change in the power supply voltage supplied to the operation circuit, at a predetermined compensation speed; and
a low-speed compensating section that compensates for the change in the power supply voltage supplied to the operation circuit, at a predetermined compensation speed lower than the compensation speed of the high-speed compensating section.

18. The test apparatus according to claim 17, wherein
the low-speed compensating section detects the change in the power supply voltage within the chip of the operation circuit, and compensates for the change in the power supply voltage based on the detection result, and
the high-speed compensating section compensates for the change in the power supply voltage based on prediction data obtained by predicting in advance an operation pattern of the operation circuit.

19. The test apparatus according to claim 18, wherein
the operation circuit is provided with power from an external power supply that generates the power supply voltage outside the chip of the electronic device,
the low-speed compensating section controls voltage generated by the external power supply based on the change in the power supply voltage detected in the chip of the operation circuit; and
the high-speed compensating section compensates for the change in the power supply voltage by causing a compensation circuit provided within the chip of the operation circuit to operate according to the prediction data.

* * * * *